Figure 1:
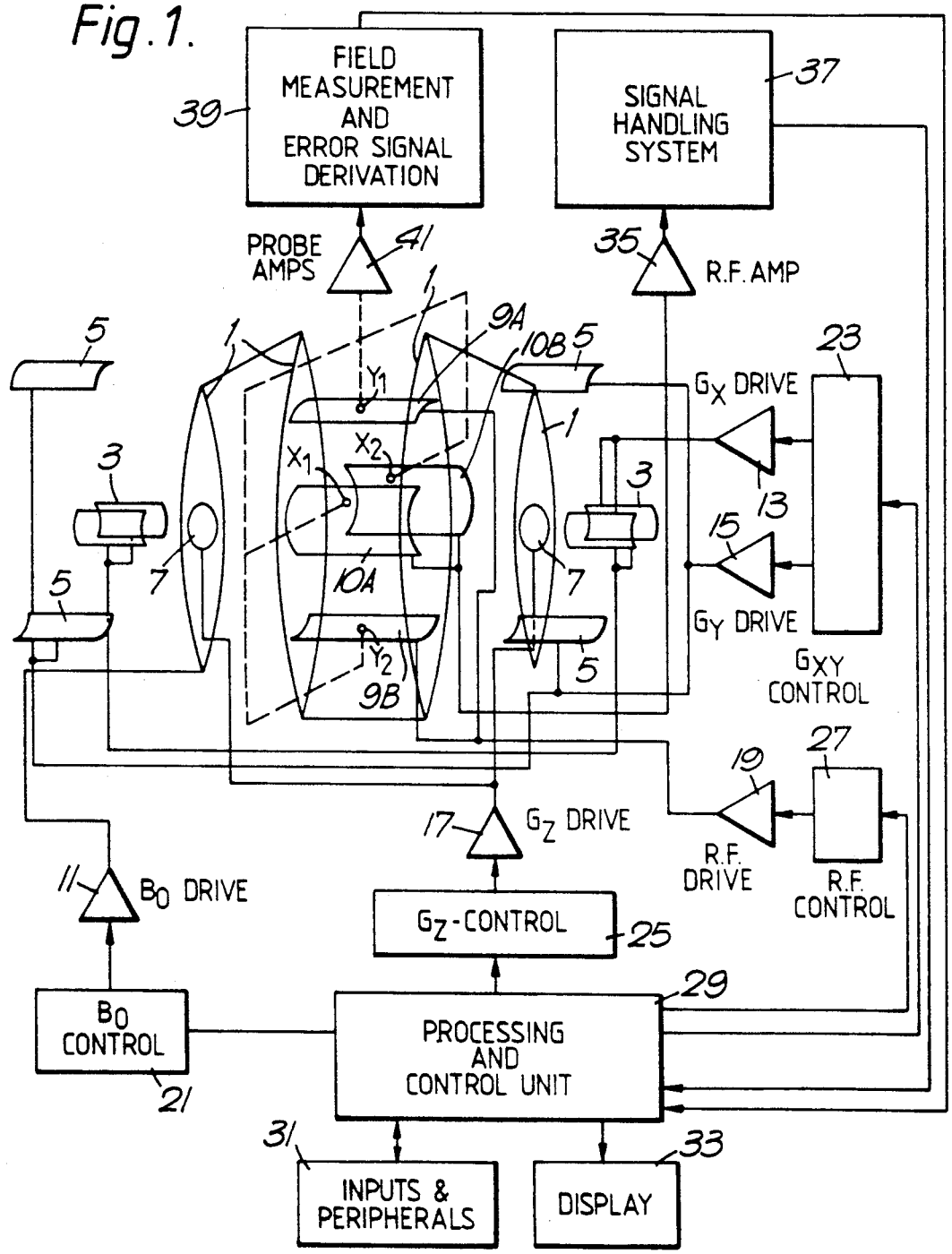

United States Patent [19]

Gilderdale

[11] Patent Number: 5,177,443
[45] Date of Patent: Jan. 5, 1993

[54] NUCLEAR MAGNETIC RESONANCE APPARATUS

[75] Inventor: David J. Gilderdale, Ashburton, United Kingdom

[73] Assignee: Picker International Limited, England

[21] Appl. No.: 635,417

[22] Filed: Jul. 30, 1984

[30] Foreign Application Priority Data

Aug. 12, 1983 [GB] United Kingdom ............... 8321769
Aug. 12, 1983 [GB] United Kingdom ............... 8321770

[51] Int. Cl.⁵ .......................................... G01R 33/20
[52] U.S. Cl. ................................... 324/318; 335/299
[58] Field of Search ............... 324/318, 319, 320, 309, 324/300; 335/299; 128/653

[56] References Cited

U.S. PATENT DOCUMENTS 2,439,827  4/1948  Sterenbuch et al. ............... 335/299
4,115,730  9/1978  Mansfield ............................ 324/309

FOREIGN PATENT DOCUMENTS 0047065  3/1982  European Pat. Off. .
0084946  8/1983  European Pat. Off. .
2056086  3/1981  United Kingdom .

Primary Examiner—Michael J. Tokar

[57] ABSTRACT

In a nuclear magnetic resonance apparatus and RF coil arrangement comprises two or more separable parts (51 and 53) adapted to be assembled around the body to be examined to form the coil arrangement. The parts are suitably arranged to be connected, when assembled, by adjustable coupling structure (55, 57, 59 and 61) so that the volume embraced by the coil arrangement may be adjusted. The invention enables the coil arrangement to be positioned more closely around a body being examined than is possible with conventional, unitary, tubular coil arrangements.

3 Claims, 3 Drawing Sheets

NUCLEAR MAGNETIC RESONANCE APPARATUS

This invention relates to nuclear magnetic resonance (NMR) apparatus.

More particularly the invention relates to NMR apparatus suitable for use in the medical examination of patients, for example, to provide an image representing the distribution in a selected region of a patient of a chosen quantity, e.g. the density of chosen nucleons, for example, hydrogen protons, or of NMR spin relaxation time constants.

Such apparatus operates by the application of a radio frequency (RF) magnetic excitation field in the presence of other magnetic fields and the sensing and analysis of the resulting nuclear magnetic resonance produced in the body. The RF fields are normally applied and the resulting signals sensed by different coils, although the same coils may be used for both functions.

It has been found desirable for these coils, more especially those used for sensing the RF fields, to be positioned as closely as possible to the body under examination, and this can present a considerable problem where the body under examination is irregularly shaped and of variable size, as is the human body.

It is an object of the present invention to provide an NMR apparatus including a coil arrangement for the application and/or sensing of RF fields which is of such a form as to alleviate this problem.

According to the present invention, in an NMR apparatus including a coil arrangement for the application of and/or sensing of RF fields during examination of a body by means of the apparatus said coil arrangement comprises at least two separable parts adapted to be assembled around a body to be examined to form said coil arrangement.

In one particular embodiment of the invention said coil arrangement, when assembled, is of tubular form, and each said part constitutes an arcuate section of the assembled arrangement.

In another particular embodiment of the invention said coil arrangement includes coupling means whereby said parts are held in position with respect to one another when assembled, said coupling means being adjustable so that the volume embraced by the coil arrangement when assembled may be adjusted.

In a further particular embodiment of the invention said coil arrangement includes electric coupling means whereby coils of different said parts are electrically connected when said coil arrangement is assembled.

In a still further particular embodiment of the invention suitable for use in examining the head of a patient, said coil arrangement, when assembled, includes a former which supports the coils of the arrangement and which provides a window through which a patient whose head is within the coil arrangement may look out.

In one such embodiment said former is in the form of a tube a portion of which has been cut away to provide said window.

In another such embodiment said window is provided by virtue of said former consisting at least partly of transparent material.

Figure 2:
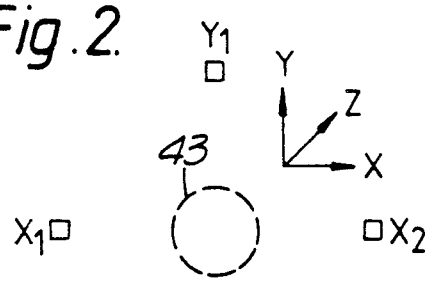
Figure 3:
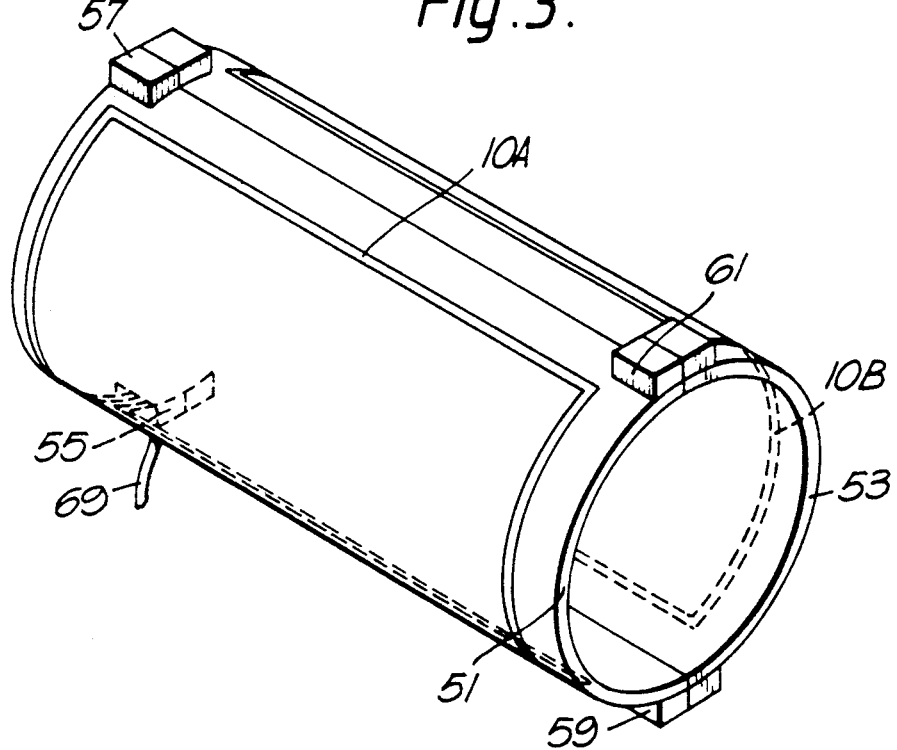
Figure 4:
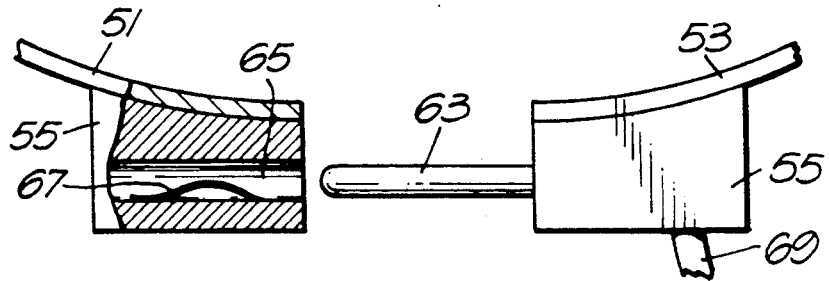
Figure 5:
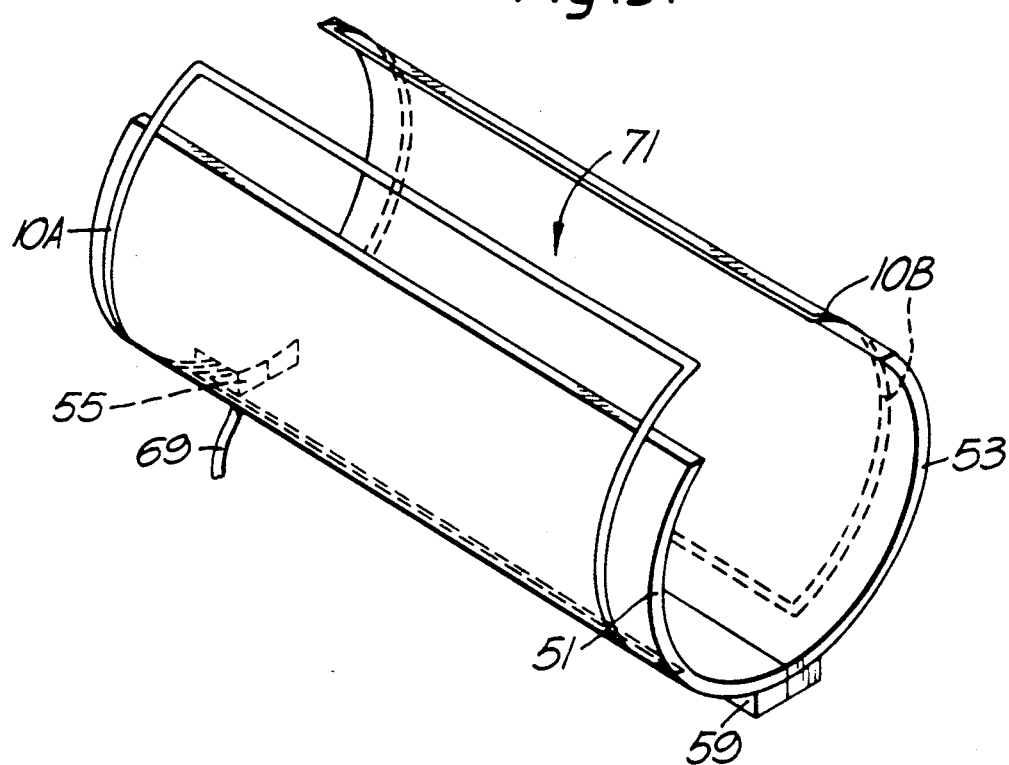
Figure 6:
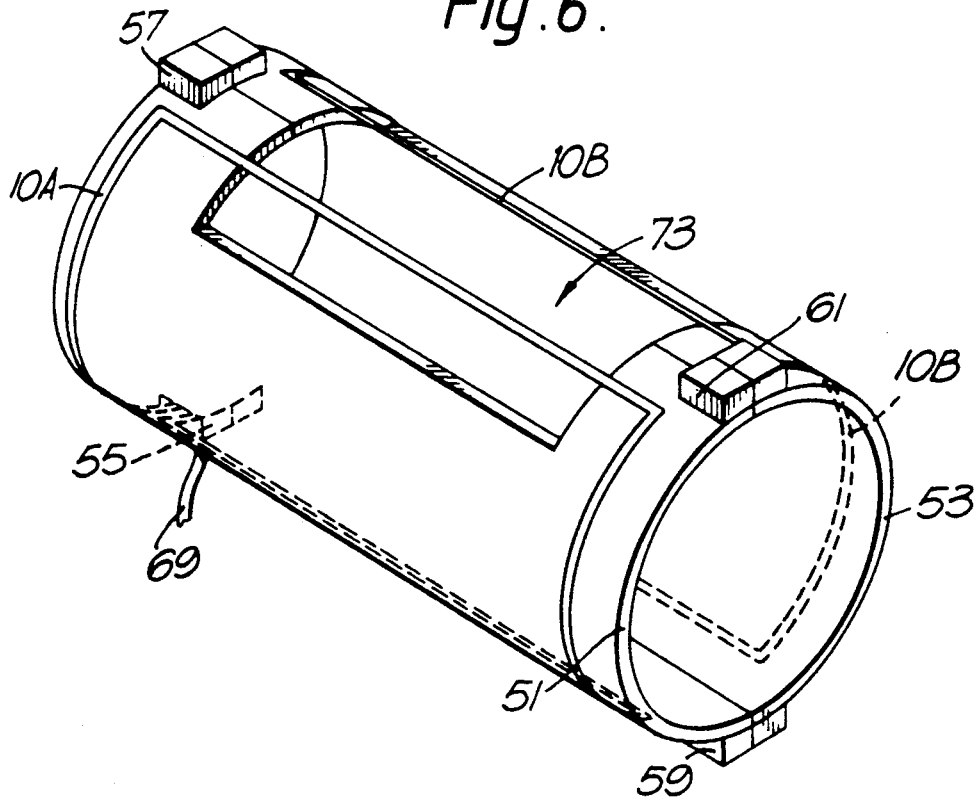

One apparatus in accordance with the invention will now be described by way of example with reference to the accompanying drawings in which:

FIGS. 1 and 2 illustrate the apparatus diagrammatically;

FIGS. 3 and 4 are diagrams illustrating the construction of a coil arrangement forming part of the apparatus; and FIGS. 5 and 6 illustrate modifications of the coil arrangement of FIGS. 3 and 4.

The apparatus is for the most part of conventional form, for example, as described in UK Patent Specification Nb. 1,578,910 or No. 2,056,078.

The basic elements of such an apparatus are as follows:

The apparatus includes a first coil system whereby a magnetic field can be applied to a body to be examined in a given direction, normally designated the Z-direction, with a gradient in any one or more of the three orthogonal directions i.e. X,Y and Z directions.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second RF coil system whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

The second coil system comprises a first coil arrangement comprising a pair of coils 9A and 9B for applying RF fields, and a second coil arrangement comprising a pair of coils 10A and 10B for detecting RF fields.

The various coils 1, 3, 5, 7, 9A and 9B are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes field measurement and error signal circuits 39 which receive signals via amplifiers 41 from field probes $X_1$, $X_2$, $Y_1$ and $Y_2$ which are disposed at suitable positions in relation to the body 43 being examined, as illustrated in FIG. 2, to monitor the applied magnetic fields.

The apparatus may be used in known manner for producing images representing the distribution of proton density or NMR spin relaxation time constants in a selected region of the body under examination. However, a knowledge of such techniques is not essential to an understanding of the present invention, and will therefore not be further described herein.

In conventional NMR imaging apparatus the RF coil system is mounted on a tubular former (not shown) and the body to be examined is inserted via one end of the former, the former being positioned within the first coil system 1, 3, 5, 7 ready to receive the body to be examined.

In the apparatus being described by way of example the coil arrangement comprising coils 9A and 9B is mounted on a tubular former (not shown) positioned within the first coil system as in conventional apparatus.

The coil arrangement comprising coils 10A and 10B is adapted to be positioned closely around the body being examined, within the coil arrangement 9A, 9B. Referring to FIG. 3, to facilitate this the coil arrangement comprising coils 10A and 10B has two parts, each part comprising one of the coils 10A and 10B mounted on a separate former 51 or 53 in the form of a semicircular arcuate portion of a tube. The two formers are adapted to fit together to form a tubular coil arrangement, as shown in FIG. 3, and are held in position with respect to one another by interlocking coupling means 55, 57, 59 and 61.

One of the coupling means 55 includes two-part electric couplings whereby the ends of the coil 10A are electrically connected to the ends of the coil 10B when the formers 51 and 53 are assembled, i.e. the coils are connected in parallel.

Referring to FIG. 4, each electric coupling comprises a plug part 63 of rectangular cross section and a complementary socket part 65 incorporating a resilient leaf portion 67 which engages the plug part 63 with a wiping action when the plug part is inserted in the socket part to minimise RF resistance.

The two coils 10A and 10B are provided with a common lead in the form of a balanced feeder 69 which is shown in the drawings connected to the plug parts of the electric couplings, but may of course equally well be connected to the socket parts of these couplings.

The coupling means 55 to 61 are arranged so as to allow for a degree of adjustment of the spacing between the two coil formers, 51 and 53 and hence of the volume embraced by the coil arrangement, as a whole.

In use of the apparatus, the two coil formers 51 and 53 are assembled around the part of the body to be examined e.g. a patient's head or neck. The adjustable spacing between the coil formers allows the coils to be fitted closely around the patient despite differences between the size of one patient and another. Furthermore, the use of a two-part coil arrangement allows the coils to be placed in close proximity to regions of the anatomy such as the neck which cannot be closely approached when the coils are mounted on a one-part tubular former.

The coil formers 51 and 53 are suitably assembled around the patient before the patient is inserted into the first coil system and the coil arrangement 9A, 9B. In this connection it is normally desirable for the two parts to separate about a vertical plane to facilitate assembly of the parts whilst the patient is lying on a couch, but it will be appreciated that this is not essential.

Whilst in the particular embodiment of the invention described about by way of example the two coil formers 51 and 53 are each of semi-circular cross-section, it will be understood that this is not necessarily the case, and that they may be of any suitable shape determined by the body, or part of a body, it is desired to image.

Bearing in mind that the coil arrangement of an apparatus in accordance with the invention is adapted to be positioned as closely as possible to a body under examination, where the coil arrangement is intended for use in examining a patient's head, it is desirable that the possibility of a patient experiencing a sense of claustrophobia during examination due to close proximity of the coil arrangement should be minimised.

To this end the coil arrangement of an apparatus according to the invention is preferably designed so as to provide a window through which a patient whose head is within the coil arrangement may look.

One possible modification to this end of the coil arrangement of FIGS. 3 and 4 is illustrated in FIG. 5 wherein an upper part of each of the formers 51 and 53 has been removed to provide a gap 71 extending axially along the length of the arrangement. The gap 71 provides a window through which a patient lying on his back with his head within the coil may look, thus reducing the possibility of the patient experiencing a sense of claustrophobia.

In another such modification illustrated in FIG. 6, a gap 73 extending only part way along the length of the arrangement is provided to provide a better support for the coils 10A and 10B at each end.

It will be appreciated that in further modifications a part of only one of the formers 51 and 53 may be cut away to provide a window through which a patient may look.

In still further modifications, instead of providing a gap, at least part of at least one of the formers 51 and 53 is made of transparent material to provide a window through which the patient may look.

It will be understood that whilst in the embodiment of the invention described above bytway of example the coils are shown diagrammatically as having a single turn, the coils may in practice have one or more turns.

Furthermore, whilst in the embodiment described the coil arrangement 10A, 10B has two separable parts, in other arrangements in accordance with the invention a coil arrangement may comprise more than two separable parts.

It will be appreciated that the close spacing to the body under examination of coils used for sensing RF fields gives a high detection sensitivity of the NMR signals produced in the body, but at the possible expense of some spatial non-uniformity in detection sensitivity. However, such non-uniformity may be taken account of in processing of the detected signals.

Whilst in general it is desirable for the coils used for applying RF fields to the body under examination to be sufficiently spaced from the body under examination to obtain good uniformity of the field in the body and for reasons of safety, if for any reason it is required to use closely spaced coils for the application of RF fields to the body, the present invention clearly facilitates this.

Thus, whilst in the particular embodiment of the invention described above by way of example the coil arrangement in accordance with the invention is used only for sensing RF fields in other embodiments of the invention the coil arrangements of the invention the coil arrangement may be used alternatively or additionally for applying RF fields.

I claim:

1. An NMR apparatus including a coil arrangement for the application of and/or sensing of RF fields during examination of a body by means of the apparatus wherein said coil arrangement comprises at least two separate parts assemblable around a body to be examined to form said coil arrangement, said apparatus being suitable for use in examining the head of a patient, wherein said coil arrangement, when assembled, includes a former which supports the coils of the arrangement and which defines a window through which a patient whose head is within the coil arrangement may look out.

2. An apparatus according to claim 1, wherein said former is in the form of a tube, a portion of which has been cut away to define said window.

3. Apparatus according to claim 1, wherein said window is defined by virtue of said former consisting at least partly of transparent material.

* * * * *